(12) United States Patent
Willmeroth et al.

(10) Patent No.: US 7,977,737 B2
(45) Date of Patent: Jul. 12, 2011

(54) SEMICONDUCTOR DEVICE HAVING ADDITIONAL CAPACITANCE TO INHERENT GATE-DRAIN OR INHERENT DRAIN-SOURCE CAPACITANCE

(75) Inventors: Armin Willmeroth, Augsburg (DE);
Winfried Kaindl, Unterhaching (DE);
Carolin Tolksdorf, Steinhoering (DE);
Anton Mauder, Kolbermoor (DE);
Holger Kapels, Holzkirchen (DE);
Gerald Deboy, Klagenfurt (AT); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 187 days.

(21) Appl. No.: 12/043,429

(22) Filed: Mar. 6, 2008

(65) Prior Publication Data
US 2009/0224302 A1    Sep. 10, 2009

(51) Int. Cl.
*H01L 29/66* (2006.01)
*H01L 21/337* (2006.01)

(52) U.S. Cl. ......... 257/329; 257/341; 257/401; 438/192
(58) Field of Classification Search .................. 257/329
See application file for complete search history.

(56) References Cited

U.S. PATENT DOCUMENTS

| 5,485,292 A * | 1/1996 | Wong et al. ........... 327/56 |
| 2002/0063281 A1* | 5/2002 | Tihanyi ............. 257/329 |
| 2005/0029584 A1* | 2/2005 | Shiraishi et al. ...... 257/329 |
| 2005/0077552 A1* | 4/2005 | Baiocchi et al. ....... 257/288 |
| 2006/0118864 A1* | 6/2006 | Hirler et al. .......... 257/335 |
| 2006/0261375 A1* | 11/2006 | Wahl et al. ........... 257/213 |
| 2008/0042172 A1* | 2/2008 | Hirler et al. .......... 257/288 |
| 2008/0197442 A1 | 8/2008 | Hirler et al. |
| 2008/0197447 A1 | 8/2008 | Halimaoui et al. |
| 2008/0265320 A1* | 10/2008 | Mauder et al. ........ 257/341 |

FOREIGN PATENT DOCUMENTS

DE    102007008777    8/2008

OTHER PUBLICATIONS

B. Jayant, Power Semiconductor Devices, Chapter 7: Power Mosfet, pp. 381-384, Copyright 1996 by PWS Publishing Company, Boston MA, (6 pages).

* cited by examiner

*Primary Examiner* — N Drew Richards
*Assistant Examiner* — Michael Jung
(74) *Attorney, Agent, or Firm* — Dicke, Billig & Czaja, PLLC

(57) ABSTRACT

A semiconductor device with inherent capacitances and method for its production. The semiconductor device has an inherent feedback capacitance between a control electrode and a first electrode. In addition, the semiconductor device has an inherent drain-source capacitance between the first electrode and a second electrode. At least one monolithically integrated additional capacitance is connected in parallel to the inherent feedback capacitance or in parallel to the inherent drain-source capacitance. The additional capacitance comprises a first capacitor surface and a second capacitor surface opposite the first capacitor surface. The capacitor surfaces are structured conductive layers of the semiconductor device on a front side of the semiconductor body, between which a dielectric layer is located and which form at least one additional capacitor.

13 Claims, 7 Drawing Sheets

SEMICONDUCTOR DEVICE HAVING ADDITIONAL CAPACITANCE TO INHERENT GATE-DRAIN OR INHERENT DRAIN-SOURCE CAPACITANCE

BACKGROUND

This disclosure relates to a semiconductor device with inherent capacitances and to a method for its production. For this purpose, the semiconductor device has an inherent gate capacitance $C_G$ of $C_G = C_{GD} + C_{GS}$ (feedback capacitance plus gate-source capacitance) at the input between a control electrode and the power electrodes. In addition, the semiconductor device has an inherent drain capacitance $C_D$ of $C_D = C_{DS} + C_{GD}$ (drain-source capacitance plus feedback capacitance) at the output between the power electrodes.

These inherent capacitances are progressively reduced as the dimensions of power semiconductor devices become steadily smaller while reverse voltages and on-state currents remain unchanged. Furthermore, compensated semiconductor devices such as "CoolMOS" are characterised by a low area-specific on resistance and by significantly smaller dimensions than conventional MOSFETs of the same absolute on resistance. The smaller dimensions, in particular the smaller chip area, automatically result in lower inherent capacitances, so that a compensated semiconductor device switches considerably faster and more steeply than a conventional MOSFET.

In non-optimized applications, the very steep di/dt in particular can generate very high voltage peaks at unavoidable parasitic inductances in the switch-off process. In addition, a very steep du/dt can induce vibrations in the parasitic and inherent circuit components of the semiconductor device, which may affect its EMI behaviour.

In order to limit both du/dt and di/dt, a gate series resistor is often installed in such applications to slow the whole switching process. This however results in the loss of the fast switching advantage of a compensated device, and the reduction in switching losses is lost as well. It therefore appears to be expedient to avoid such series resistors and to find solutions which do not require such series resistors.

For these and other reasons, there is a need for the present invention.

SUMMARY

An embodiment of the invention relates to a semiconductor device with inherent capacitances in a semiconductor body and to a method for its production. The semiconductor device has an inherent input capacitance ($C_{GD}$) between a control electrode and a first electrode. In addition, the semiconductor device has an inherent output capacitance ($C_{DS}$) between the first electrode and a second electrode. At least one monolithically integrated additional capacitance ($C_Z$) is connected in parallel with the inherent input capacitance ($C_{GD}$) or the inherent output capacitance ($C_{DS}$). The additional capacitance ($C_Z$) includes a first capacitor surface and a second capacitor surface located opposite the first capacitor surface. The capacitor surfaces are structured conductive layers of the semiconductor device on a front side of the semiconductor body, between which a dielectric layer forms at least one additional capacitor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
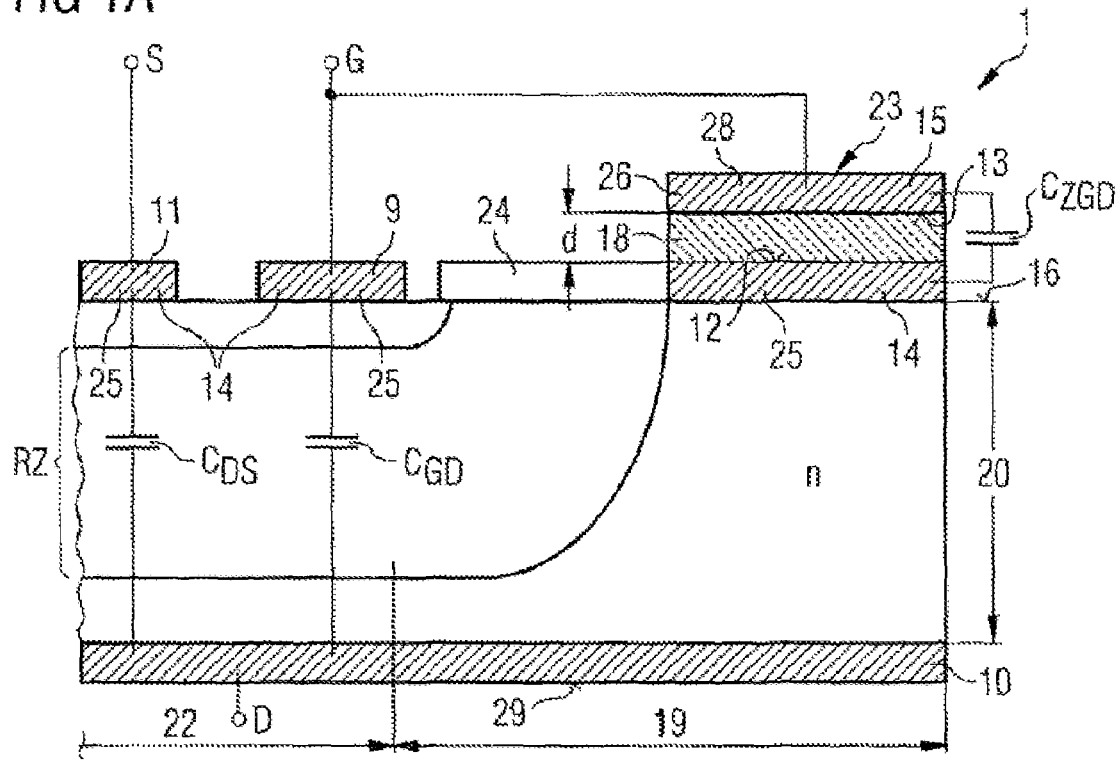
FIG. 1 illustrates a diagrammatic cross-section through a section of a semiconductor device according to an embodiment.
Figure 1B:
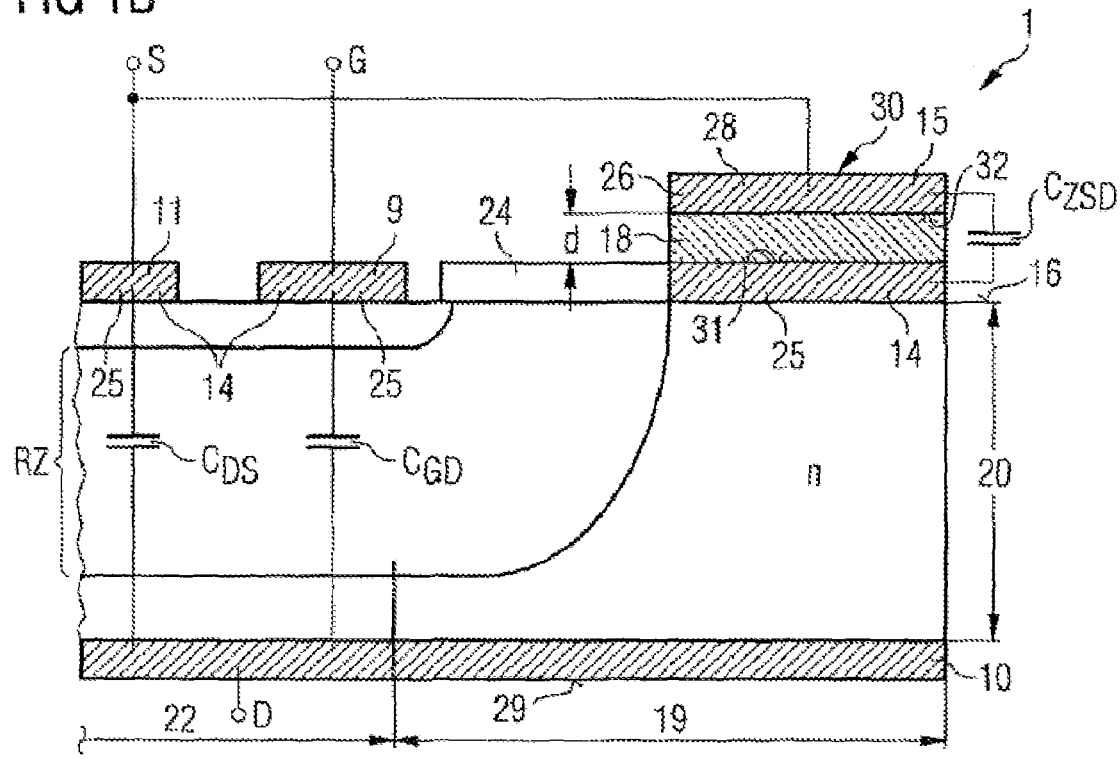

FIGS. 1A and 1B illustrate diagrammatic cross-sections through a section of a semiconductor device 1 according to an embodiment. This section of the semiconductor device 1 is structured on a semiconductor body 20 made of monocrystalline silicon, the semiconductor body 20 being provided on its back side 29 with a first electrode represented by a drain electrode D of a MOSFET. On its front side 16, the semiconductor body 20 is provided with a first structured conductive layer 14, which forms a second electrode 11 as a source electrode S of the semiconductor device and represents a control electrode 9 as a gate electrode G of a compensated power transistor.

While the first electrode 10 completely covers the back side both in a cell region 22 and in an edge region 19, the coverage of the second electrode 11 serving as a source electrode is limited to the central cell region 22; the same applies to the control electrode 9, which as a gate electrode only occupies part of the front side 16 in the central cell region 22 of the semiconductor device. The metal of the gate electrode only amounts to a small part, the electrically active area being made of polysilicon and covering the major part of the cell region 22. For clarity, the microstructure of the semiconductor body 20 of this charge-compensated field effect transistor is not illustrated in the drawing, but the inherent feedback capacitance $C_{GD}$ in the cell region 22 and the size of the space charge zone RZ, which deflects towards the front side 16 of the semiconductor body 20 in the edge region are indicated. Further details of the edge structure are not illustrated. The edge region contains a dielectric 24, which ensures that the high field strength values prevailing in the silicon do not reach the surrounding plastic compression moulding compound or the atmosphere, where they could lead to arcing.

In the outer part of the edge region 19, the semiconductor body 20 is n-doped, allowing the drain potential to penetrate from the first electrode 10 to the front side 16 of the semiconductor body 20, where a first capacitor surface 12 is located in the edge region 19, which is therefore likewise at drain potential. This first capacitor surface 12 includes a first structured conductive layer 14, which can be structured at the same time as the electrode 11 and the control electrode 9.

This first capacitor surface 12 supports a dielectric layer 18 with a thickness d, which is sufficient to insulate the gate-drain voltage in the arrangement illustrated in FIG. 1A. Opposite the first capacitor surface 12, there is a second capacitor surface 13 on the dielectric layer 18, which is electrically connected to the control electrode 9 in the embodiment illustrated in FIG. 1A. Together with the dielectric layer 18 placed in between, the two capacitor surfaces 12 and 13 form a first additional capacitor 23, which supplies an additional capacitance $C_{ZGD}$ to increase additively the inherent input capacitance $C_{GD}$.

This increased input capacitance $C_{GD}+C_{ZGD}$ slows the switching action of the transistor. In this context, it has been found that a slowing by using the input capacitance $C_{GD}$ together with the additional capacitance $C_{ZGD}$ results in a lesser increase in switching losses than a slowing using a gate series resistor as used in prior art.

In the semiconductor device illustrated in FIG. 1A, an additive capacitance added to the input capacitance $C_{GD}$ is therefore not generated by using an additional surface between metal and silicon, but by providing a highly effective additional capacitance between two metal layers. These metal layers may consist of a first structured conductive layer 14 and contain polysilicon, while the second structured conductive layer 15 may contain a metal alloy to form the second capacitor surface 13. The interposed dielectric layer 18 with its thickness d may contain one or more materials from the group including oxides, nitrides, glass, ceramics, imides and high-K materials.

As illustrated in FIG. 1A, the second capacitor surface 13 may act together with a gate designed as a lateral gate of a vertical compensated semiconductor device or as a trench gate of a vertical compensated semiconductor device. The additional capacitance $C_{ZGD}$ of an additional capacitor 23, which is here arranged in the edge region 19 as a lateral structure and extending laterally, may alternatively be monolithically integrated into the semiconductor body in a vertical position. For this purpose, trench walls of a trench structure can be coated with an insulating layer followed by metal layers opposite one another, whereupon a dielectric can be placed between these trench walls. Such vertically arranged additional capacitances are useful if the semiconductor device is already provided with trench structures for trench gate electrodes and/or for vertical field plates.

In this case, the structure of the additional capacitor is, in contrast to the illustrated embodiment, oriented not laterally, but nearly vertically. In addition, an additional capacitor of this type is not only suitable for the MOSFET illustrated here with its drain electrode D on the back side of the semiconductor body, but also for an IGBT (insulated gate bipolar transistor), wherein the drain electrode would be replaced by a capacitor electrode or a back side emitter electrode. The second electrode of the semiconductor device would correspondingly be an emitter electrode.

A method for the production of a semiconductor chip for a semiconductor device 1 of the type illustrated in FIG. 1A includes the following processes. A semiconductor wafer is structured from a semiconductor body 20 with semiconductor device structures in semiconductor chip positions, which include MOSFET and/or IGBT structures with an electrode 10 on the back side 29 and a second electrode 11 on the front side 16 of the semiconductor wafer. Using the metallization structure, at least one further capacitor surface 12 is produced on the front side. This is followed by the application of a dielectric layer 18 at least in the region of the first capacitor surface 12 of the semiconductor chip, which is then structured. Finally, an additional capacitor 23 is formed at least in the region of the first capacitor surface 12 by the application of a second metallization structure with a second capacitor surface 13 to the dielectric layer 18. The second capacitor surface 13 of the additional capacitor 23 including two metal layer regions 25 and 26 located opposite one another and an interposed dielectric layer 18 can be monolithically connected to the gate potential of the semiconductor device by suitable conductors on the front side 16 of the semiconductor body 20.

The further processes of producing a complete semiconductor device from a semiconductor chip of this type would be evident to one skilled in the art having the benefit of this disclosure are known and are thus not described in detail. The dielectric layer 18 between the two capacitor surfaces 12 and 13 on the front side of the semiconductor body 20 is applied with a thickness d which ensures that the electric strength of the dielectric layer is higher than the maximum reverse voltage applied between drain and source. However, before a first additional capacitor 23 with an additional capacitance $C_{ZGD}$ is produced, the semiconductor body has been provided with a lateral gate electrode or with a vertical trench gate structure in the semiconductor body. In addition, charge compensation zones, body zones and drift zones have already been produced in the cell region 22.

FIG. 1B illustrates a diagrammatic cross-section through a section of the semiconductor device 1 illustrated FIG. 1 A, wherein an additional capacitor 30 supplying an additional capacitance $C_{ZGD}$ is implemented in the edge region 19 of the semiconductor device 1, which in FIG. 1B is added to the inherent capacitance $C_{DS}$. Components of the same function as those in FIG. 1A are identified by the same reference numbers and not explained in detail. The additional capacitor 30 has corresponding opposite capacitor surfaces 31 and 32, between which a dielectric layer 18 with a thickness d is arranged as illustrated in FIG. 1A.

An output capacitance lower than the inherent input capacitance results in a steeper increase of drain voltage in the switching-off process. For this reason, it is useful as illustrated in FIG. 1B to increase the inherent output capacitance $C_{GD}$ with an additional capacitor 30 with a capacitance $C_{ZDS}$. In the embodiment illustrated in FIG. 1B, the output capacitance $C_{DS}$ is significantly increased compared to a component with only one metallization layer by structuring two metallization layers to create an additional capacitor 30 in order to increase the inherent output capacitance $C_{DS}$.

This makes use of the fact that the edge region 19 of the semiconductor chip is at drain potential to a very high degree. It is therefore possible to create both an additive additional capacitance $C_{ZGD}$ and an additional capacitance $C_{ZDS}$ in the edge region of the semiconductor chip by using two metal layers and a dielectric located in between. In this first embodiment illustrated in FIGS. 1A and 1B, the active cell region 22 is not covered by the second metal layer 15. In addition, in the embodiment illustrated in FIGS. 1A and 1B, a high-voltage region 24 is provided in the edge region 19 between the region 22 and the regions of the additional capacitors 23 and 30 respectively, where the field strength is reduced towards the edge, so that the first capacitor surface 12 is at drain potential.

In the embodiment illustrated in FIG. 1B, the dielectric material for the dielectric layer 18 between the two capacitor surfaces 31 and 32 on the front side 16 of the semiconductor body 20 is applied at a thickness d which ensures that the electric strength of the dielectric layer 18 is higher than the breakdown voltage of the semiconductor device 1, for in this embodiment illustrated in FIG. 1B, the second capacitor surface 32 opposite the first capacitor surface 31 is connected to the source potential of the second electrode 11. A polysilicon layer can be used to produce the structured conductive layer 14. The two structured coatings 14 and 15 are produced using a metal alloy.

Figure 2:
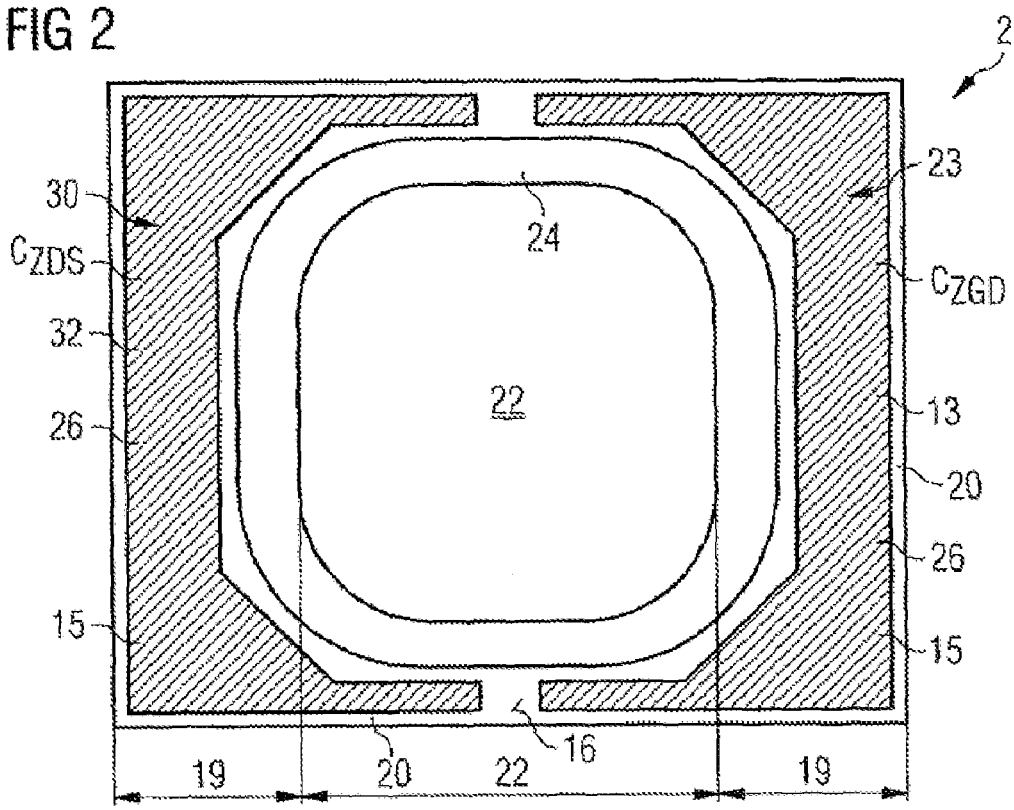
FIG. 2 illustrates a diagrammatic top view of a section of a semiconductor device according to a further embodiment

FIG. 2 illustrates a diagrammatic top view of a section of a semiconductor device 2 according to a further embodiment. This top view diagrammatically illustrates the structured front side of a semiconductor chip for a semiconductor device 2 according to the further embodiment. A cell region 22 in the center of the semiconductor chip is surrounded by a high voltage strip 24. Of the additional capacitors 23 and 30, the second capacitor surfaces 13 and 32 can be seen.

The surfaces of the additional capacitances $C_{ZGD}$ and $C_{ZDS}$ located in the edge region 19 are identified by hatching. They form part of a second structured metallization layer 26 and lie on the dielectric layer, which cannot be seen in the drawing and which cover the likewise invisible first electrodes of the additional capacitors 21 and 30 respectively. These edge structures with the additional capacitors 23 and 30 are located on the front side 16 of the semiconductor body 20. In the embodiment illustrated in FIG. 2, the areas of the two the additional capacitors 23 and 30 are equal in size.

Figure 3:
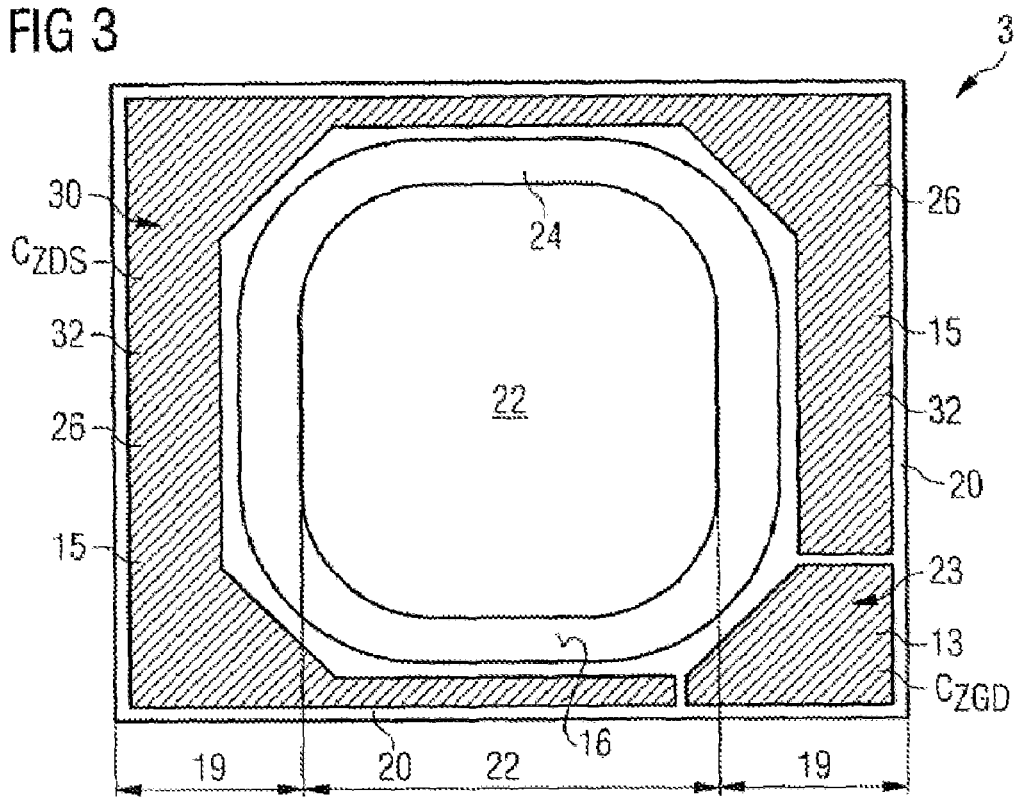
FIG. 3 illustrates a diagrammatic top view of a section of a semiconductor device according to a further embodiment.

FIG. 3 illustrates a diagrammatic top view of a section of a semiconductor device 3 according to a further embodiment. Components of the same function as those in preceding figures are identified by the same reference numbers and not explained in detail. The diagrammatic top view of this embodiment differs from the embodiment illustrated in FIG. 2 in that the value of the inherent input capacitance $C_{GD}$ relative to the output capacitance $C_{DS}$ has been taken into account in the dimensioning of the additional capacitors 23 and 30, the lower input capacitance $C_{GD}$ being provided with an additional capacitor 23 having a lower capacitance $C_{ZGD}$ than the additional capacitor 30 with the larger capacitor surfaces 32 and thus with a higher additional capacitance $C_{ZDS}$. The structure and the size of the cell field 22 with the high voltage strip 24 remain unchanged, and they are not used for creating additional capacitors.

Figure 4:
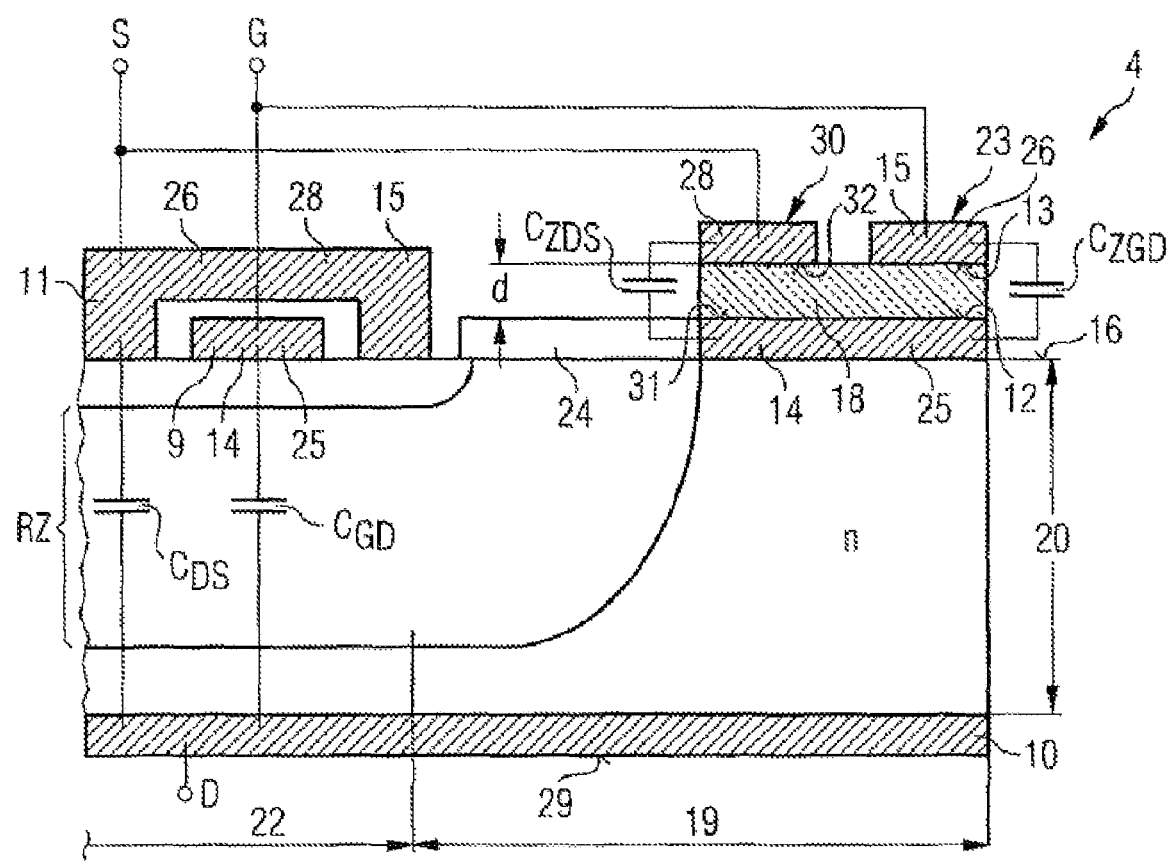
FIG. 4 illustrates a diagrammatic cross-section through a section of a semiconductor device according to a further embodiment.

FIG. 4 illustrates a diagrammatic cross-section through a section of a semiconductor device 4 according to a further embodiment. In this embodiment, the additional capacitors 23 and 30 are created in the edge region 19 by suitably structuring the second metallization 26 in the edge region 19.

In addition FIG. 4 illustrates that two metallization layers 14 and 15 are provided in the cell region 22 as well; these however only form the control electrode 9 on the one hand and the second electrode 11 on the other hand. In a top view of this semiconductor device 4, the additional capacitors 23 and 30 would be arranged as rings around the cell region 22 and outside the high voltage strip 24.

Figure 5:
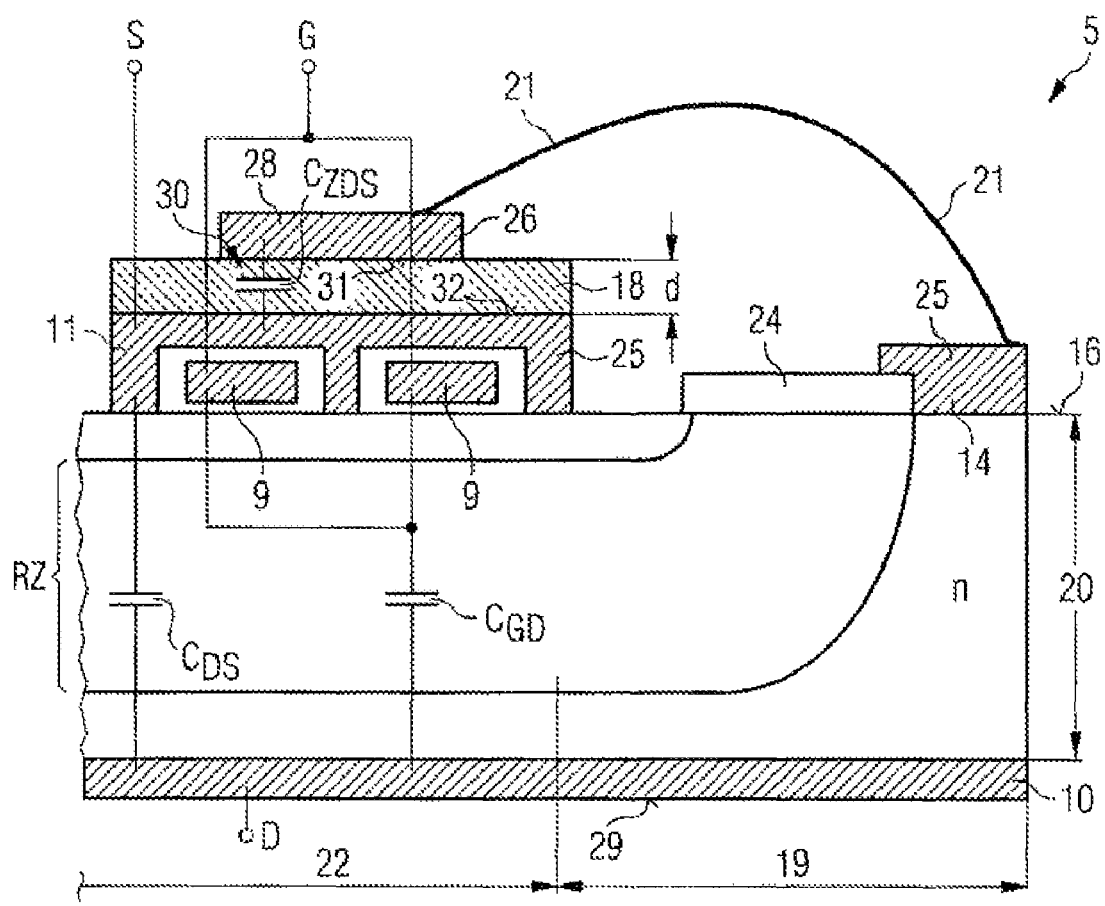
FIG. 5 illustrates a diagrammatic cross-section through a section of a semiconductor device according to a further embodiment.

FIG. 5 illustrates a diagrammatic cross-section through a section of a semiconductor device 5 according to a further embodiment. In this embodiment, the inherent output capacitance $C_{DS}$ is increased by an additional capacitance $C_{ZDS}$ by applying to the source electrode located in the cell region 22 a dielectric layer 18 of the thickness d and by depositing a further upper metallization layer 28 selectively on the dielectric layer 18. By using a bonding wire connection 21, the high voltage strip 24 is bridged and the capacitor surface 31 of the additional capacitor 30 is connected to an edge metallization at drain potential.

This edge metallization is once again located outside the high voltage strip 24. As a result, an additive drain-source capacitance $C_{ZDS}$ is integrated above the active cell region 22. In this variant, the additional capacitance $C_{ZDS}$ does not require any additional surface, as in most power transistors the active surface is larger than required for bonding the source region. The rest of the metallised source region has enough space for the additional capacitance $C_{ZDS}$. As long as the dielectric layer 18 representing the capacitance dielectric projects far enough over the metallization as illustrated in FIG. 5, this structure is capable of blocking the applied drain-source voltage.

Figure 6:
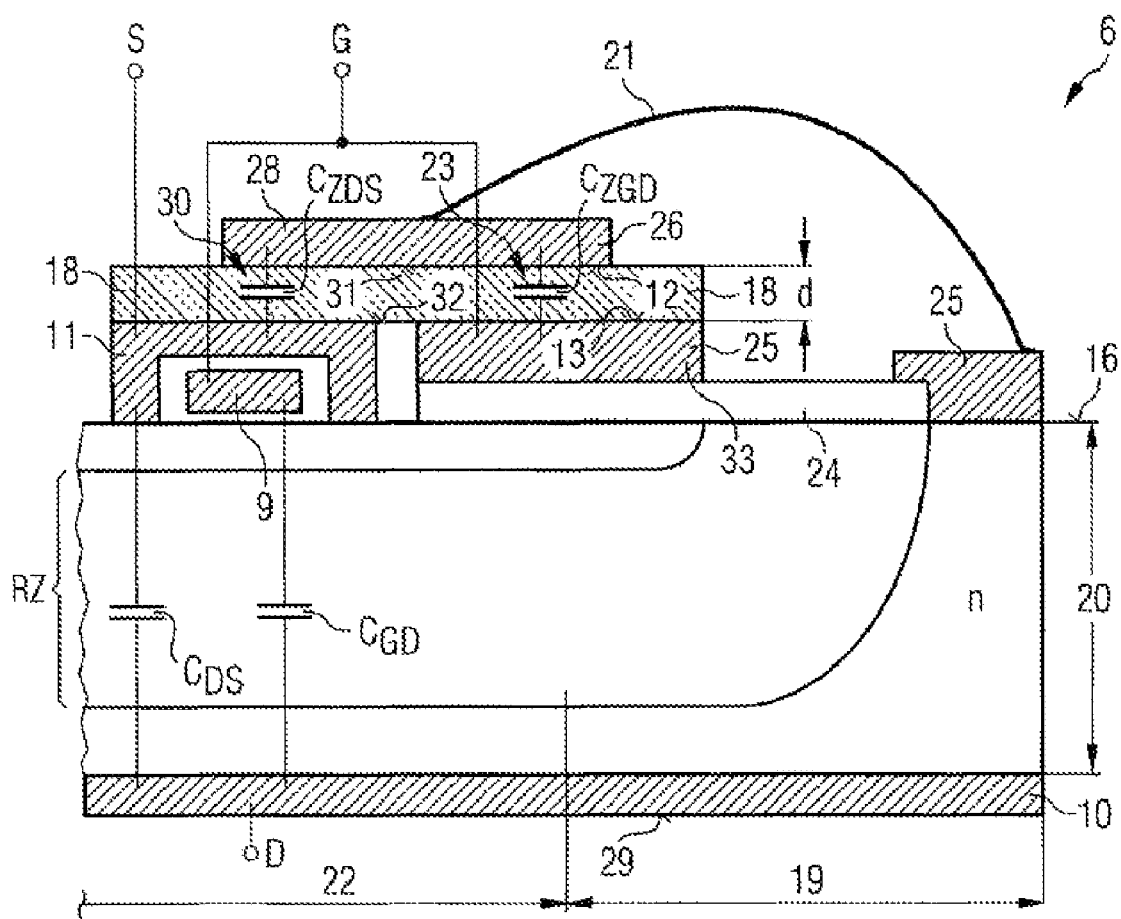
FIG. 6 illustrates a diagrammatic cross-section through a section of a semiconductor device according to a further embodiment.

FIG. 6 illustrates a diagrammatic cross-section through a section of a semiconductor device 6 according to a further embodiment. Components of the same function as those in FIG. 5 are identified by the same reference numbers and not explained in detail. This embodiment differs from the preceding embodiment in that an additive gate-drain capacitance $C_{ZGD}$ is integrated in the cell region 22 of the semi-conductor device 6 over a part of the gate connection surface 33. Additional capacitors 23 and 30 are therefore monolithically integrated both for the input capacitance $C_{GD}$ and for the output capacitance $C_{DS}$, wherein a dielectric layer 18 is selectively applied both above the source electrode surface 11 and above the gate connection surface 33, so that is covers a larger area than that occupied by the capacitor surfaces on the dielectric layer 18. In this case, too, the drain potential in the edge region 19 of the semiconductor device 6 can be transmitted to the capacitor surfaces 31 and 12 of the additional capacitors 23 and 24 via a bond connection 21.

Figure 7:
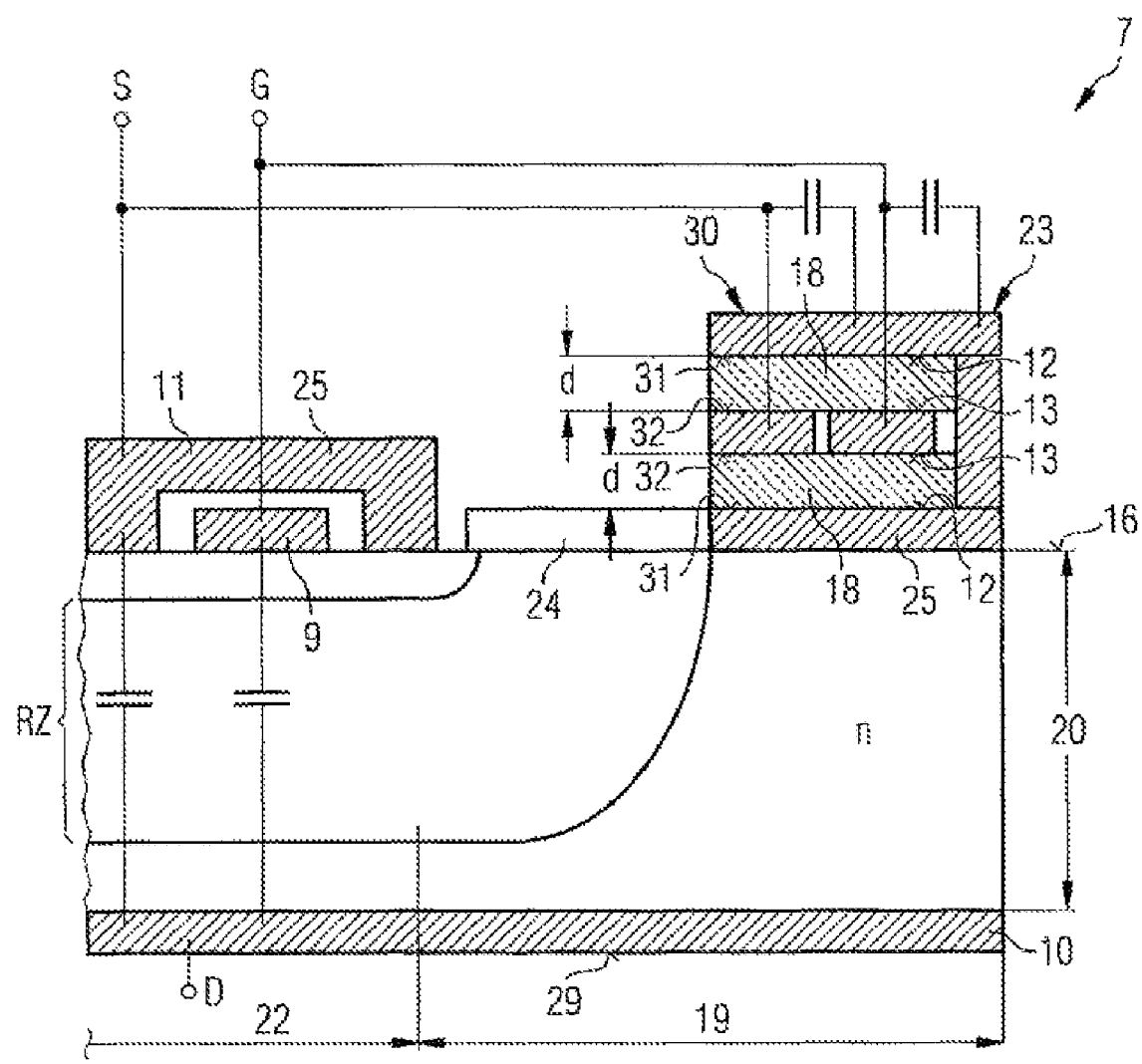
FIG. 7 illustrates a diagrammatic cross-section through a section of a semiconductor device according to a further embodiment.

FIG. 7 illustrates a diagrammatic cross-section through a section of a semiconductor device 7 according to a further embodiment. This embodiment differs from the preceding embodiments in that three metal layers 25, 26 and 27 are applied and structured in the edge region 19 of the semiconductor device 7 outside the high voltage strip 24. Owing to these three metal layers 25, 26 and 27 with dielectric layers 18 placed in between, either smaller edge regions 19 than in the preceding embodiments can supply equal capacitance values of the additional capacitors 23 and 30, or the capacitance values of the additional capacitors 23 and 30 can be nearly doubled in a semiconductor body 20 with front sides 16 of the same size as in the preceding figures.

Figure 8:
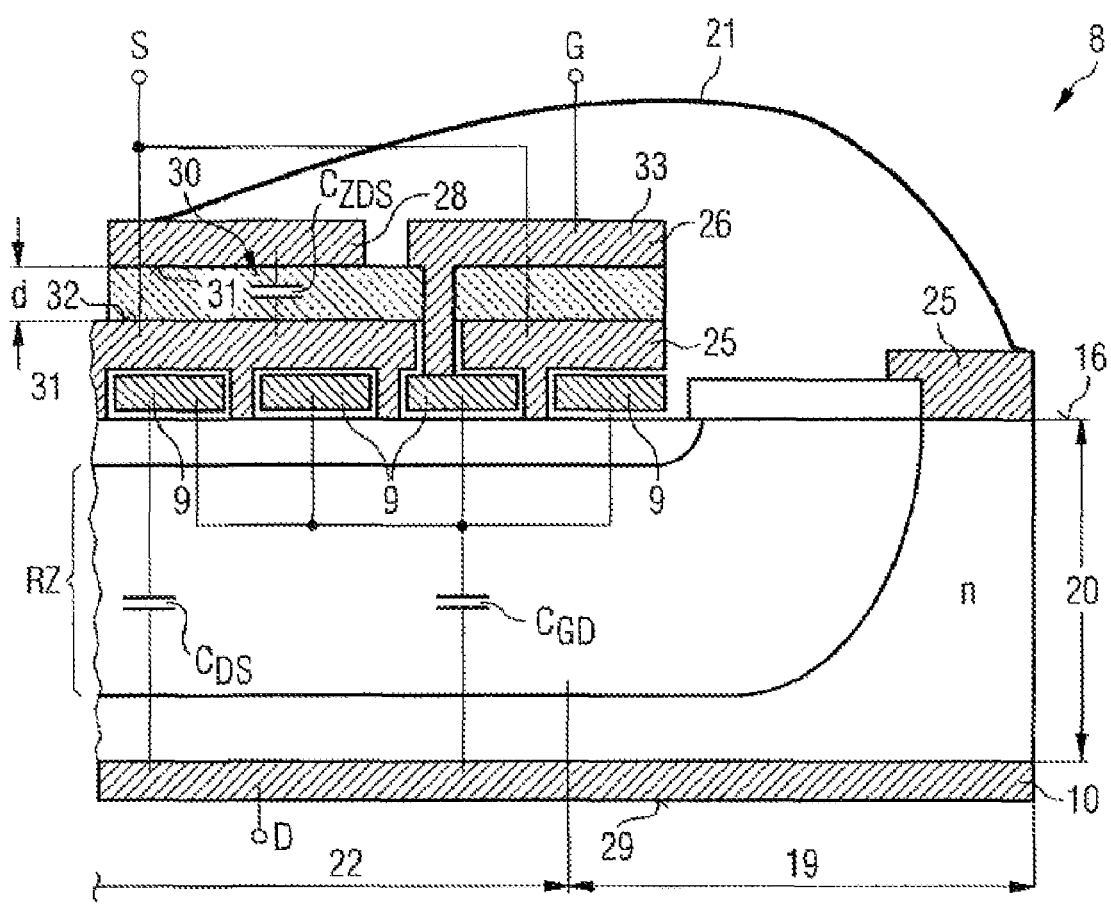
FIG. 8 illustrates a diagrammatic cross-section through a section of a semiconductor device according to a further embodiment.

FIG. 8 illustrates a diagrammatic cross-section through a section of a semiconductor device 8 according to a further embodiment. In this embodiment, an upper metal layer 28 in the cell region 22 of the semiconductor device 8 has multiple uses. In addition to being used as an electrode for an additive capacitance $C_{ZDS}$, this upper metal layer 28 is also used as a gate connection surface 33. Owing to the second metal layer 26, it is possible to place active cells in the region below a gate connection surface 33.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor body;
   a control electrode on a front side of the semiconductor body;
   a first electrode on a back side of the semiconductor body and electrically connected to the control electrode such that an inherent feedback capacitance exists between the control electrode and the first electrode;
   a second electrode on a front side of the semiconductor body and electrically connected to the first electrode such that an inherent drain-source capacitance exists between the first electrode and the second electrode;
   at least one additional monolithically integrated capacitor connected in parallel to the control electrode or the second electrode; and
   wherein the at least one additional monolithically integrated capacitor includes a first conductive layer directly contacting the front side of the semiconductor body and having a first capacitor surface, a second conductive layer having a second capacitor surface opposite and parallel to the first capacitor surface, and a dielectric layer located directly on the first capacitor surface and the second capacitor surface.

2. The semiconductor device of claim 1, wherein the second capacitor surface made of an electrically conductive material covers edge regions of a front side of the semiconductor device and is electrically connected to the control electrode via at least one bonding wire connection.

3. The semiconductor device of claim 1, wherein the first capacitor surface is located above a central cell region of the semiconductor device.

4. The semiconductor device of claim 1, wherein the control electrode comprises a gate electrode of a charge compensation device and wherein the semiconductor device is a power semiconductor device.

5. The semiconductor device of claim 1, wherein the control electrode comprises a lateral gate electrode or a vertical trench gate structure.

6. The semiconductor device of claim 1, wherein the control electrode is an insulated gate electrode of a MOSFET or an IGBT and wherein the first electrode is a drain electrode of a MOSFET or the collector electrode of an IGBT, and wherein the second electrode is a source electrode of a MOSFET or the emitter electrode of an IGBT.

7. The semiconductor device of claim 1, wherein the at least one additional monolithically integrated capacitor includes first and second monolithically integrated capacitors having different capacitances, the first additional capacitor having a lower capacitance than the second additional capacitor.

8. The semiconductor device of claim 1, wherein the semiconductor device comprises at least one highly doped structured polysilicon layer and a structured metal layer.

9. The semiconductor device of claim 1, wherein the semiconductor device comprises a plurality of structured metal layers insulated from and placed on top of one another.

10. The semiconductor device of claim 1, wherein the semiconductor device comprises a monolithically integrated capacitor above the second electrode to provide an additional drain-source capacitance.

11. The semiconductor device of claim 1, wherein the semiconductor device comprises a monolithically integrated capacitor above the second electrode to provide an additional capacitance acting together with the feedback capacitance.

12. The semiconductor device of claim 1, wherein the semiconductor device comprises an upper metal layer structured as a gate electrode or an additional first capacitor surface.

13. The semiconductor device of claim 1, wherein the additional capacitance includes metal layers located opposite one another arranged on trench walls of a trench structure of a semiconductor body.

* * * * *